(12) United States Patent
Fujio et al.

(10) Patent No.: US 11,605,761 B2
(45) Date of Patent: *Mar. 14, 2023

(54) LIGHT-EMITTING DEVICE

(71) Applicant: NICHIA CORPORATION, Anan (JP)

(72) Inventors: Kazushige Fujio, Tokushima (JP); Masaki Kondo, Tokushima (JP)

(73) Assignee: NICHIA CORPORATION, Anan (JP)

( * ) Notice: Subject to any disclaimer, the term of this patent is extended or adjusted under 35 U.S.C. 154(b) by 297 days.

This patent is subject to a terminal disclaimer.

(21) Appl. No.: 17/028,496

(22) Filed: Sep. 22, 2020

(65) Prior Publication Data

US 2021/0013383 A1     Jan. 14, 2021

Related U.S. Application Data

(63) Continuation of application No. 16/142,586, filed on Sep. 26, 2018, now Pat. No. 10,818,827.

(30) Foreign Application Priority Data

Sep. 28, 2017    (JP) ............................. JP2017-188523

(51) Int. Cl.
    *H01L 33/48*       (2010.01)
    *H01L 33/50*       (2010.01)
          (Continued)

(52) U.S. Cl.
    CPC ........ *H01L 33/504* (2013.01); *C09K 11/7734* (2013.01); *C09K 11/7774* (2013.01);
          (Continued)

(58) Field of Classification Search
    CPC ......... H01L 33/32; H01L 33/56; H01L 33/62; H01L 33/486; H01L 33/504; H01L 33/507; C09K 11/7734; C09K 11/7774
See application file for complete search history.

(56) References Cited

U.S. PATENT DOCUMENTS

| | | |
|---|---|---|
| 4,135,113 A | 1/1979 | Tsuneta et al. |
| 7,138,660 B2 | 11/2006 | Ota et al. |
| | (Continued) | |

FOREIGN PATENT DOCUMENTS

| | | |
|---|---|---|
| JP | 2003535477 A | 11/2003 |
| JP | 2003535478 A | 11/2003 |
| | (Continued) | |

OTHER PUBLICATIONS

United States Patent and Trademark Office, Ex-Parte Quayle Office Action dated Jan. 31, 2017 issued in U.S. Appl. No. 15/196,964, 5 pages.

(Continued)

*Primary Examiner* — Bijan Ahvazi
(74) *Attorney, Agent, or Firm* — Hunton Andrews Kurth LLP

(57) ABSTRACT

A light-emitting device is provided. The light-emitting device includes a light-emitting element having a peak light-emitting wavelength in the range of 440 nm to 470 nm, and a fluorescent member. The fluorescent member includes a first fluorescent material having a peak light-emitting wavelength in the range of 480 nm to less than 520 nm, a second fluorescent material having a peak light-emitting wavelength in the range of 520 nm to less than 600 nm, and a third fluorescent material having a peak light-emitting wavelength in the range of 600 nm to 670 nm. The light-emitting device has a ratio of an effective radiant intensity for melatonin secretion suppression to an effective radiant intensity for blue-light retinal damage of 1.53 to 1.70 when the light-emitting device emits light with a correlated color temperature of 2700 K to less than 3500 K; 1.40 to 1.70 when the light-emitting device emits light with a correlated color temperature of 3500 K to less than 4500 K; 1.40 to 1.70 when the light-emitting device emits light with a (Continued)

correlated color temperature of 4500 K to less than 5700 K; and 1.35 to 1.65 when the light-emitting device emits light with a correlated color temperature of 5700 K to 7200 K.

21 Claims, 3 Drawing Sheets

(51) Int. Cl.
  C09K 11/77    (2006.01)
  H01L 33/32    (2010.01)
  H01L 33/56    (2010.01)
  H01L 33/62    (2010.01)

(52) U.S. Cl.
  CPC .. *C09K 11/77342* (2021.01); *C09K 11/77348* (2021.01); *H01L 33/32* (2013.01); *H01L 33/486* (2013.01); *H01L 33/507* (2013.01); *H01L 33/56* (2013.01); *H01L 33/62* (2013.01)

(56) References Cited

U.S. PATENT DOCUMENTS

| | | | |
|---|---|---|---|
| 7,611,641 B2 | 11/2009 | Schmidt et al. | |
| 7,750,359 B2 | 7/2010 | Narendran et al. | |
| 7,897,987 B2 | 3/2011 | Inoue et al. | |
| 7,990,045 B2 | 8/2011 | Zukauskas et al. | |
| 8,084,934 B2 | 12/2011 | Kim et al. | |
| 8,277,687 B2 | 10/2012 | Takahashi et al. | |
| 8,404,153 B2 | 3/2013 | Comanzo et al. | |
| 8,508,117 B2 | 8/2013 | Negley et al. | |
| 8,704,440 B2 | 4/2014 | Zheng et al. | |
| 8,916,887 B2 | 12/2014 | Kim | |
| 9,028,718 B2 | 5/2015 | Kijima et al. | |
| 9,142,732 B2 | 9/2015 | Luo et al. | |
| 9,281,456 B2 | 3/2016 | Masuda et al. | |
| 9,537,060 B2 | 1/2017 | Yoon et al. | |
| 9,735,323 B2 * | 8/2017 | Asai | H05B 33/14 |
| 2008/0149957 A1 | 6/2008 | Kameshima et al. | |
| 2009/0194781 A1 | 8/2009 | Harada | |
| 2009/0224177 A1 | 9/2009 | Kinomoto et al. | |
| 2009/0231832 A1 | 9/2009 | Zukauskas et al. | |
| 2010/0224895 A1 | 9/2010 | Murazaki et al. | |
| 2012/0306356 A1 | 12/2012 | Yoon et al. | |
| 2013/0002124 A1 | 1/2013 | Izumi et al. | |
| 2013/0033167 A1 | 2/2013 | Dong et al. | |
| 2013/0120967 A1 | 5/2013 | Liao | |
| 2014/0008680 A1 | 1/2014 | Won et al. | |
| 2014/0036499 A1 | 2/2014 | Yamakawa et al. | |
| 2014/0293577 A1 | 10/2014 | Yamakawa et al. | |
| 2014/0293608 A1 | 10/2014 | Kanahira | |
| 2015/0014725 A1 | 1/2015 | Hong et al. | |
| 2015/0152327 A1 | 6/2015 | Inoue et al. | |
| 2015/0153010 A1 | 6/2015 | Okuyama et al. | |
| 2015/0349213 A1 * | 12/2015 | Hosokawa | H01L 33/502 257/98 |
| 2016/0079484 A1 * | 3/2016 | Hosokawa | H01L 33/502 257/98 |
| 2016/0218255 A1 | 7/2016 | Kim | |
| 2017/0005239 A1 * | 1/2017 | Asai | C09K 11/00 |
| 2017/0256684 A1 * | 9/2017 | Asai | C09K 11/0883 |
| 2019/0097098 A1 | 3/2019 | Fujio et al. | |

FOREIGN PATENT DOCUMENTS

| | | | |
|---|---|---|---|
| JP | 2006253336 A | 9/2006 |
| JP | 2008227523 A | 9/2008 |
| JP | 2014170082 A | 9/2014 |
| JP | 2014209617 A | 11/2014 |
| JP | 2015061009 A | 3/2015 |
| JP | 2015113358 A | 6/2015 |
| JP | 2015142056 A | 8/2015 |
| JP | 2015163689 A | 9/2015 |
| JP | 2016187035 A | 10/2016 |
| JP | 2017017132 A | 1/2017 |
| JP | 2017168795 A | 9/2017 |
| JP | 2017183522 A | 10/2017 |
| WO | 2010098141 A1 | 9/2010 |
| WO | 2012144087 A1 | 10/2012 |
| WO | 2013061943 A1 | 5/2013 |
| WO | 2015002139 A1 | 1/2015 |

OTHER PUBLICATIONS

United States Patent and Trademark Office, Notice of Allowance dated Apr. 12, 2017 issued in U.S. Appl. No. 15/196,964, 8 pages.

* cited by examiner

LIGHT-EMITTING DEVICE

CROSS-REFERENCE TO RELATED APPLICATIONS

This is a continuation application of U.S. patent application Ser. No. 16/142,586, filed Sep. 26, 2018, which claims priority to Japanese Patent Application No. 2017-188523, filed on Sep. 28, 2017, the disclosures of which are hereby incorporated by reference in their entirety.

TECHNICAL FIELD

The present disclosure relates to a light-emitting device.

DESCRIPTION OF THE RELATED ART

As a light-emitting device including a light-emitting element such as a light emitting diode (LED), white light-emitting devices including a blue light-emitting element and a fluorescent material that emits, for example, yellow light are well known. Such light-emitting devices are used in a wide range of fields including general lighting, in-vehicle lighting, displays, and backlights for liquid crystal displays. With the spread of LED lighting, concerns are growing about the effects of blue light included in LED lighting on the human body. One such concern is, for example, retinal damage caused by blue light. For example, International Patent Publication No. WO 2012/144087 describes the possibility of LED lighting affecting the human circadian rhythm (biological rhythm).

SUMMARY

A light-emitting device is provided. The light-emitting device includes a light-emitting element having a peak light-emitting wavelength in the range of 440 nm to 470 nm, and a fluorescent member. The fluorescent member includes a first fluorescent material having a peak light-emitting wavelength in the range of 480 nm to less than 520 nm, a second fluorescent material having a peak light-emitting wavelength in the range of 520 nm to less than 600 nm, and a third fluorescent material having a peak light-emitting wavelength in the range of 600 nm to 670 nm. The light-emitting device has a ratio of the effective radiant intensity for melatonin secretion suppression to the effective radiant intensity for blue-light retinal damage of 1.53 to 1.70 when the light-emitting device emits light with a correlated color temperature of 2700 K to less than 3500 K; 1.40 to 1.70 when the light-emitting device emits light with a correlated color temperature of 3500 K to less than 4500 K; 1.40 to 1.70 when the light-emitting device emits light with a correlated color temperature of 4500 K to less than 5700 K; and 1.35 to 1.65 when the light-emitting device emits light with a correlated color temperature of 5700 K to 7200 K. A lighting tool including the light-emitting device is also provided.

DETAILED DESCRIPTION

Figure 1:
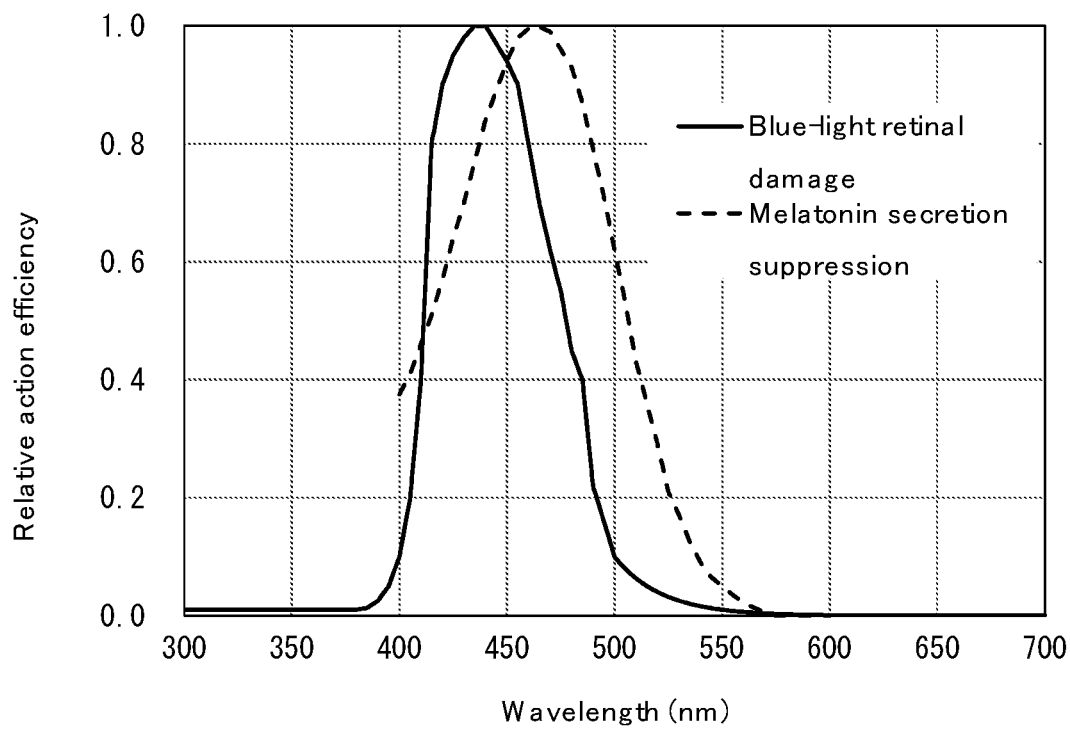
FIG. 1 is a graph showing an action function of blue-light retinal damage and an action function of melatonin secretion suppression.

The embodiments of the present disclosure will now be described with reference to drawings. However, the embodiments described below are exemplary light-emitting devices for embodying the technical concept of the present invention, and the present invention is not limited to the light-emitting devices described below. The members defined in the claims are not limited to the members of the embodiments. Specifically, for example, the sizes, materials, shapes, and relative arrangements of the components described in the embodiments are mere illustration examples, and do not limit the scope of the present invention only to those described unless otherwise specified. The relationship between the color names and the chromaticity coordinates, the relationship between the wavelength ranges of light and the color names of monochromatic light, and others are in accordance with Japanese Industrial Standard (JIS) Z 8110. When a component contained in a composition has a plurality of corresponding substances, the amount of the component indicates the total amount of its corresponding substances present in the composition unless otherwise specified. An average particle diameter is a value called Fisher Sub Sieve Sizer's No. determined by an air permeability method. A half bandwidth of a light-emitting element or a fluorescent material is a wavelength width of an emission spectrum at 50% emission intensity of the maximum emission intensity in the emission spectrum.

Light-Emitting Device

The light-emitting device includes a light-emitting element having a peak light-emitting wavelength in the range of 440 nm to 470 nm, and a fluorescent member. The fluorescent member may include a first fluorescent material having a peak light-emitting wavelength in the range of 480 nm to less than 520 nm, a second fluorescent material having a peak light-emitting wavelength in the range of 520 nm to less than 600 nm, and a third fluorescent material having a peak light-emitting wavelength in the range of 600 nm to 670 nm. The light-emitting device may have a ratio of the effective radiant intensity for melatonin secretion suppression to the effective radiant intensity for blue-light retinal damage of 1.53 to 1.70 when the light-emitting device emits light with a correlated color temperature of 2700 K to less than 3500 K; 1.40 to 1.70 when the light-emitting device emits light with a correlated color temperature of 3500 K to less than 4500 K; 1.40 to 1.70 when the light-emitting device emits light with a correlated color temperature of 4500 K to less than 5700 K; and 1.35 to 1.65 when the light-emitting device emits light with a correlated color temperature of 5700 K to 7200 K.

Blue-light retinal damage is considered to be largely attributable to light with a wavelength of 430 nm to 440 nm. Light with a wavelength of about 465 nm is considered to cause melatonin secretion suppression. An embodiment of the present disclosure is a light-emitting device having an emission spectrum that has less effect on the human body.

The light-emitting device has an emission spectrum with the ratio of the effective radiant intensity for melatonin secretion suppression to the effective radiant intensity for blue-light retinal damage (hereinafter simply referred to as "effective radiant intensity ratio") in the specific range determined by the correlated color temperature of light emitted by the light-emitting device. This further reduces the effects of light emitted by the light-emitting device on the human body compared with known light-emitting devices while reducing a decrease in the luminous flux of the light-emitting device. The effects on the human body as used herein refer to the risk of blue-light retinal damage and inhibition of melatonin secretion suppression. For example, the effective radiant intensity ratio not less than the lower limit sufficiently reduces the risk of blue-light retinal damage, and sufficiently reduces melatonin secretion. Thus, the light-emitting device emits light that can increase work efficiency of people under the light. The effective radiant intensity ratio not more than the upper limit further reduces a decrease in luminosity.

As shown in the mathematical expression below, an effective radiant intensity $L_B$ is obtained by integrating the product of an action function $B(\lambda)$ of blue-light retinal damage or melatonin secretion suppression and the spectral distribution (spectral radiance) $L(\lambda)$ of a light-emitting device in a predetermined wavelength range. To obtain a spectral distribution for relative comparison of the effective radiant intensities, the luminosity of the subject light-emitting device is equalized to the luminosity of a light-emitting device to be compared. Specifically, the luminous flux of the subject light-emitting device is measured using an integrating sphere to obtain a coefficient that equalizes the luminous flux of the subject light-emitting device to the luminous flux of the light-emitting device to be compared. The spectrum of the subject light-emitting device is then multiplied by the coefficient to obtain a spectral distribution to be used for the calculation of the effective radiant intensity for the relative comparison. An action function of blue-light retinal damage is defined, for example, by JIS C 7550:2014. Also, an action function of melatonin secretion suppression is defined, for example, in G C. Brainard et al.: Action Spectrum for Melatonin Regulation in Humans: Evidence for a Novel Circadian Photoreceptor, J. Neuroscience, 21 (16), 6405-6412, 2001. An action function of blue-light retinal damage and an action function of melatonin secretion suppression are shown in FIG. 1. In FIG. 1, the horizontal axis indicates wavelength, and the vertical axis indicates relative action efficiency. Each relative action efficiency was obtained by normalizing the corresponding action function with the maximum value of the corresponding action efficiency.

$$L_B = \int L(\lambda) \cdot B(\lambda) \cdot \Delta\lambda$$

The light-emitting device with a correlated color temperature of 2700 K to less than 3500 K may have an effective radiant intensity ratio of, for example, 1.53 to 1.70, preferably 1.54 to 1.65, and more preferably 1.54 to 1.63 to achieve a balance between luminosity and the effects on the human body.

The light-emitting device with a correlated color temperature of 3500 K to less than 4500 K may have an effective radiant intensity ratio of, for example, 1.40 to 1.70, preferably 1.45 to 1.70, and more preferably 1.46 to 1.68.

The light-emitting device with a correlated color temperature of 4500 K to less than 5700 K may have an effective radiant intensity ratio of, for example, 1.40 to 1.70, preferably 1.43 to 1.60, and more preferably 1.43 to 1.58.

The light-emitting device with a correlated color temperature of 5700 K to 7200 K may have an effective radiant intensity ratio of, for example, 1.35 to 1.65, preferably 1.37 to 1.55, and more preferably 1.37 to 1.53.

A light-emitting device 100 according to the present embodiment will now be described in detail with reference to FIG. 2. The light-emitting device 100 is a surface-mount light-emitting device. The light-emitting device 100 includes a light-emitting element 10, and a molded body 40 in which the light-emitting element 10 is disposed. The light-emitting element 10 emits visible light at short wavelengths (e.g., in the range of 380 nm to 485 nm) and has a peak light emission wavelength in the range of 440 nm to 470 nm. The molded body 40 includes a first lead 20, a second lead 30, and a resin portion 42, which are formed in an integral manner. The molded body 40 has a recess defined by a bottom surface and side surfaces, and the light-emitting element 10 is disposed on the bottom surface of the recess. The light-emitting element 10 has a pair of electrodes, positive and negative, and the positive and negative electrodes are electrically connected to the first lead 20 and the second lead 30, respectively, with a wire 60. The light-emitting element 10 is covered with a fluorescence member 50. The fluorescence member 50 contains, for example, at least three fluorescent materials: a first fluorescent material 71, a second fluorescent material 72, and a third fluoride fluorescent material 73 as a fluorescent material 70, and a resin.

The fluorescence member 50 serves not only as a member for converting the wavelength of light emitted by the light-emitting element 10, but also as a member for protecting the light-emitting element 10 from the external environment. In FIG. 2, the particles of the fluorescent material 70 are unevenly dispersed in the fluorescence member 50. The particles of the fluorescent material 70 arranged near the light-emitting element 10 in this manner efficiently converts the wavelength of light from the light-emitting element 10. This produces a light-emitting device with a high light emitting efficiency. The particles of the fluorescent material 70 may not be arranged near the light-emitting element 10 in the fluorescence member 50, and may be arranged apart from the light-emitting element 10 in the fluorescence member 50 to avoid heat from the light-emitting element 10. Also, the particles of the fluorescent material 70 may be approximately evenly dispersed in the entire fluorescence member 50 to obtain light with further reduced color unevenness.

Figure 2:
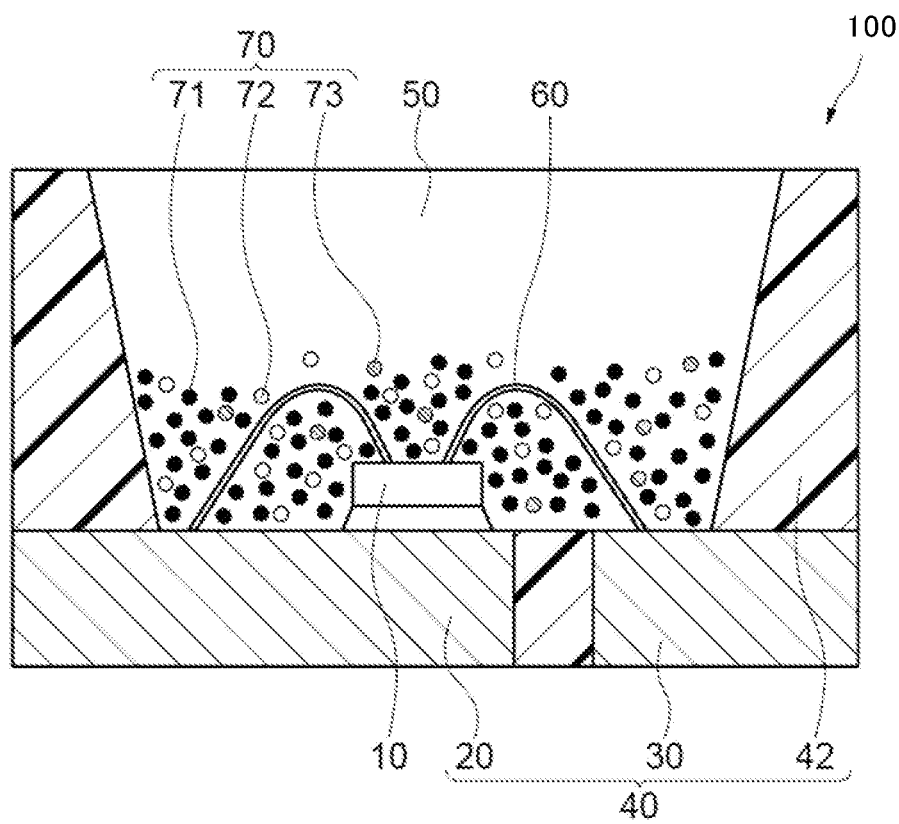
FIG. 2 is a schematic cross-sectional view of a light-emitting device according to the present disclosure.
Figure 3:
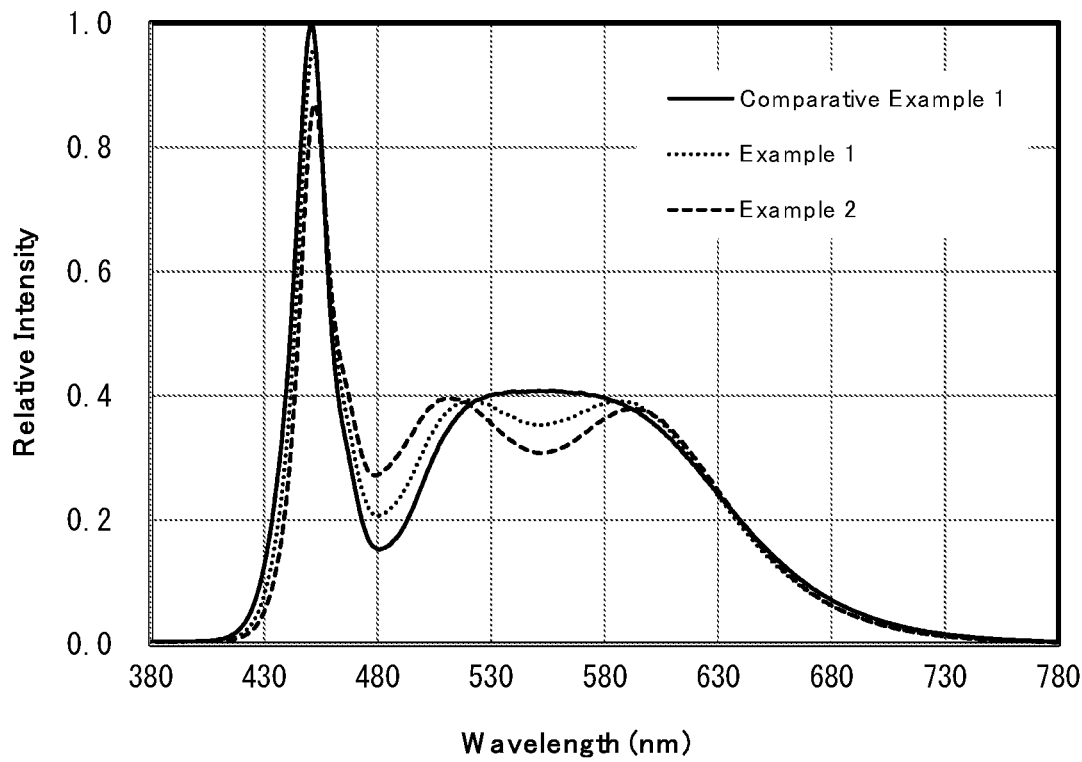
FIG. 3 is a graph showing emission spectra of light-emitting devices according to the present disclosure and a comparative example.
Figure 4:
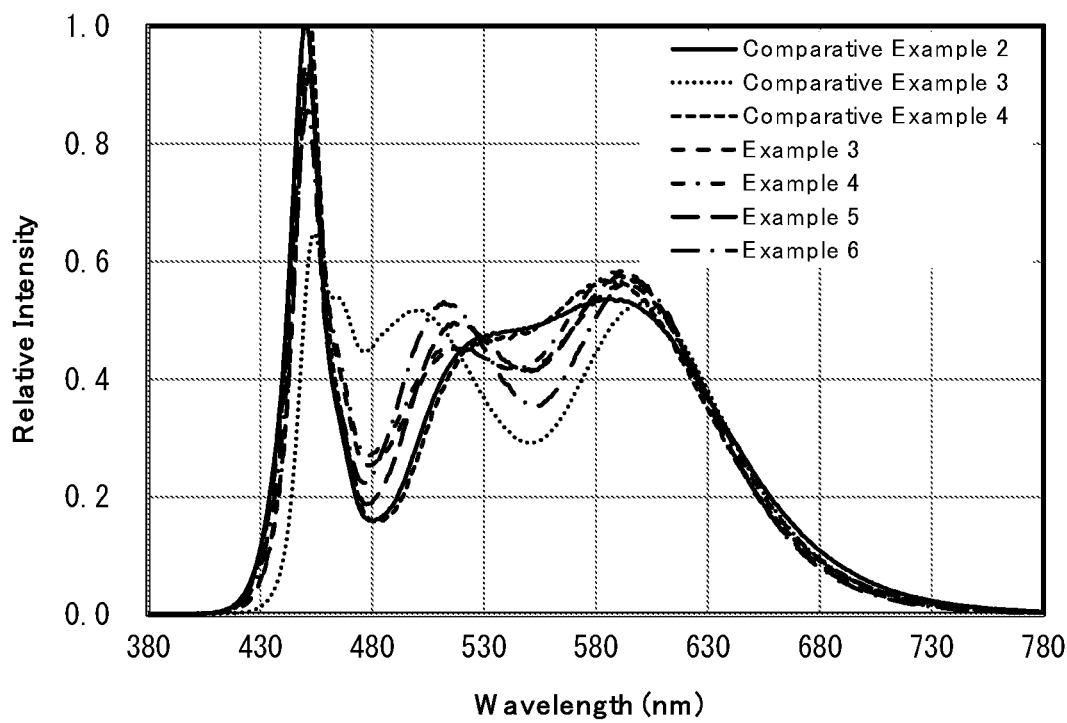
FIG. 4 is a graph showing emission spectra of light-emitting devices according to the present disclosure and comparative examples.
Figure 5:
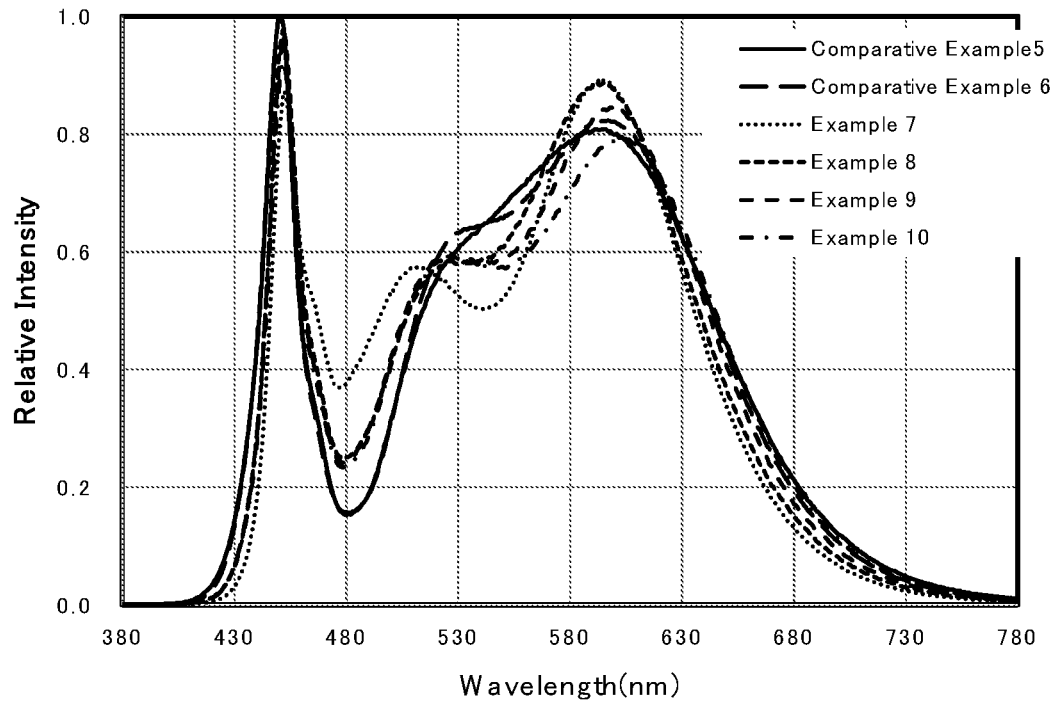
FIG. 5 is a graph showing emission spectra of light-emitting devices according to the present disclosure and comparative examples.
Figure 6:
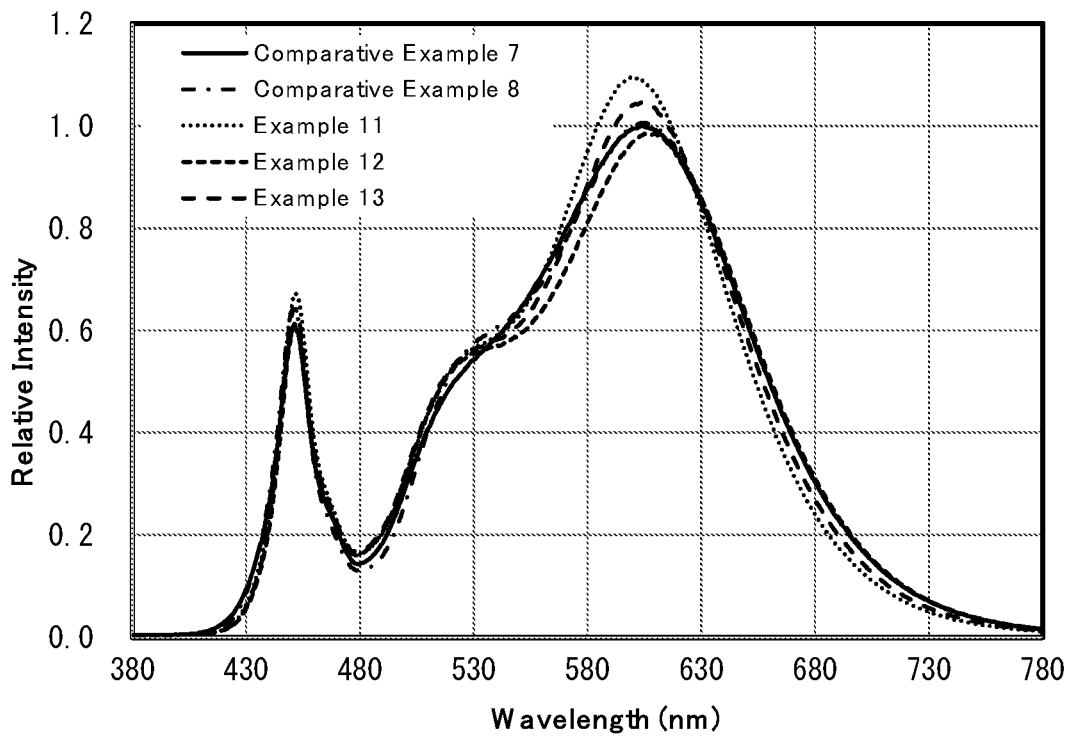
FIG. 6 is a graph showing emission spectra of light-emitting devices according to the present disclosure and comparative examples.

The fluorescent material 70 in FIG. 2 is a mixture of the first fluorescent material 71, the second fluorescent material 72, and the third fluorescent material 73. However, the second fluorescent material may be arranged on the third fluorescent material 73, and the first fluorescent material 71 may be arranged on the second fluorescent material 72 (the arrangement not shown), or the first fluorescent material 71 may be arranged on a mixture of the second material 72 and the third fluorescent material 73 (the arrangement not shown). The first fluorescent material 71, the second fluorescent material 72, and the third fluorescent material 71 may be arranged in any manner.

Light-Emitting Element 10

The light-emitting element 10 may have a peak light-emitting wavelength in the range of 440 nm to 470 nm, and preferably in the range of 445 nm to 465 nm to reduce both retinal damage and melatonin secretion suppression. The light-emitting element 10 having a peak light-emitting wavelength in this range may be partially used as an excitation light source for the fluorescent material 70. This allows efficient use of a part of light emitted from the light-emitting element 10 as a part of light to be emitted outside, and produces a highly efficient light-emitting device. In addition, the light-emitting device may have a peak light-emitting wavelength in the long-wavelength region rather than in the near-ultraviolet region, and thus may contain less ultraviolet ray components. Thus, the light-emitting device may be safer as a light source. The light-emitting element 10 may have an emission spectrum with a half bandwidth of, for example, 30 nm or less. The light-emitting element 10 is preferably a semiconductor light-emitting element such as an LED. A semiconductor light-emitting element containing a nitride semiconductor ($In_XAl_YGa_{1-X-Y}N$ where X and Y satisfy $0 \le X$, $0 \le Y$, and $x+y \le 1$) may be used as the light source to produce a highly efficient light-emitting device that has high output linearity to the input and is resistant and stable to mechanical impact.

Fluorescent Member 50

The fluorescent member 50 may include at least one first fluorescent material 71 having a peak light-emitting wavelength in the range of 480 nm to less than 520 nm, at least one second fluorescent material 72 having a peak light-emitting wavelength in the range of 520 nm to less than 600 nm, and at least one third fluorescent material 73 having a peak light-emitting wavelength in the range of 600 nm to 670 nm when excited by light emitted by the light-emitting element 10. The fluorescent member 50 may further include other fluorescent materials and resin as appropriate.

First Fluorescent Material 71

The first fluorescent material 71 may have a peak light-emitting wavelength in the range of 480 nm to less than 520 nm, and preferably in the range of 485 nm to 515 nm. The first fluorescent material 71 may have an emission spectrum with a half bandwidth of, for example, 30 nm or more, preferably 40 nm or more, and more preferably 50 nm or more, and, for example, 80 nm or less, and preferably 70 nm or less.

The first fluorescent material 71 may have a reflectance of 30% or less, preferably 25% or less, more preferably 20% or less, and still more preferably 16% or less relative to the reflectance of calcium hydrogen phosphate in the wavelength range of 380 nm to 435 nm. The lower limit of the relative reflectance may be, for example, 2% or more. With a relative reflectance of 30% or less, high energy-light with a wavelength of not more than 435 nm may be at least partially efficiently absorbed. Thus, a light-emitting device that emits less light with a wavelength of not more than 435 nm, at which the risk of retinal damage is high, can be produced. The relative reflectance of the first fluorescent material 71 is determined as a spectral reflectance of the first fluorescent material 71 when the spectral reflectance of calcium hydrogen phosphate ($CaHPO_4$ with an average particle diameter of 2.7 μm) in the wavelength range of 380 nm to 435 nm is taken as 100%. As used herein, a relative reflectance of 30% or less means that the maximum value of the relative reflectance in the range of 380 nm to 435 nm is 30% or less.

The first fluorescent material 71 may be preferably at least one selected from the group consisting of alkaline-earth metal aluminates and alkaline-earth metal halosilicates to achieve an intended emission intensity and reduce the risk of retinal damage by the light-emitting device. An alkaline-earth metal aluminate is, for example, a europium-activated fluorescent material containing at least strontium, and having a composition represented by, for example, formula (1A). An alkaline-earth metal halosilicate is, for example, a europium-activated fluorescent material containing at least calcium and chlorine, and having a composition represented by, for example, formula (1B).

$$Sr_4Al_{14}O_{25}:Eu \tag{1A}$$

$$(Ca,Sr,Ba)_8MgSi_4O_{16}(F,Cl,Br)_2:Eu \tag{1B}$$

In formula (1A), Sr may be partially substituted by at least one element selected from the group consisting of Mg, Ca, Ba, and Zn.

The composition represented by formula (1A) may be represented by formula (1a) below:

$$(Sr_{1-x}Eu_x)_4Al_{14}O_{25} \tag{1a}$$

In formula (1a), x satisfies $0.01 \le x \le 0.5$, preferably satisfies $0.05 \le x \le 0.4$, and more preferably satisfies $0.1 \le x \le 0.3$; and Sr may be partially substituted by at least one element selected from the group consisting of Mg, Ca, Ba, and Zn.

The first fluorescent material 71 may have an average particle diameter of, for example, 3 μm to 40 μm, and preferably 5 μm to 30 μm. An average particle diameter not less than the lower limit may achieve a high emission intensity. An average particle diameter not more than the upper limit may improve workability during the production process of the light-emitting device.

The first fluorescent material 71 may include a surface-treated fluorescent material. The surface-treated fluorescent material includes, for example, fluorescent material particles containing alkaline-earth metal aluminate, and a phosphoric acid compound arranged on the surfaces of the fluorescent material particles. The surface-treated fluorescent material particles on the surfaces of which a phosphoric acid compound is arranged may have, for example, an improved moisture resistance.

Examples of the phosphoric acid compound include Group 2 element (alkaline-earth metal) phosphates such as magnesium phosphate, calcium phosphate, strontium phosphate, and barium phosphate; rare-earth phosphates such as scandium phosphate, yttrium phosphate, and lanthanoid (La, Ce, Pr, Nd, Pm, Sm, Eu, Gd, Tb, Dy, Ho, Er, Tm, Yb, and Lu) phosphates; Group 13 element phosphates such as boron phosphate, aluminium phosphate, gallium phosphate, and indium phosphate; zinc phosphate, antimony phosphate, and bismuth phosphate. Preferable is at least one selected from the group consisting of these compounds, more preferable is at least one selected from the group consisting of Group 2 element phosphates, rare-earth phosphates, and Group 13 element phosphates. Still more preferable is at least one selected from the group consisting of magnesium phosphate, calcium phosphate, strontium phosphate, barium phosphate, aluminium phosphate, gallium phosphate, scandium phosphate, yttrium phosphate, and lanthanide phosphates including lanthanum phosphate. Particularly preferable is at least one selected from the group consisting of magnesium phosphate, calcium phosphate, strontium phosphate, barium phosphate, yttrium phosphate, and lanthanoid phosphate including lanthanum phosphate.

The phosphoric acid compound may be arranged as particles or as a film on the surfaces of the fluorescent material particles. The phosphoric acid compound may be preferably arranged as a film to improve moisture resistance. The phosphoric acid compound arranged as a film as used herein means that the particles of the phosphoric acid compound may not be observed, and 50% or more, and preferably 70% or more of the surface areas of the fluorescent material particles may be covered with the phosphoric acid compound.

The surface-treated fluorescent material may contain the phosphoric acid compound as, for example, a phosphoric acid content of, 0.0001% by mass to 20% by mass, preferably 0.1% by mass to 10% by mass, more preferably 1% by mass to 8% by mass, and still more preferably 1.5% by mass to 5.6% by mass relative to the total mass of the fluorescent material. The fluorescent material containing the phosphoric acid compound not less than the lower limit may have further improved moisture resistance. The fluorescent material containing the phosphoric acid compound not more than the upper limit can effectively reduce a decrease in emission efficiency. Further, the phosphoric acid compound may have a metal content of 0.0001% by mass to 20% by mass, preferably 0.01% by mass to 10% by mass, more preferably 0.2% by mass to 3% by mass, and still more preferably 0.36% by mass to 1.4% by mass. The phosphoric acid compound containing the metal content in this range is likely to have a crystal structure and a composition that are more effective in achieving the object of the present disclosure.

In the surface-treated fluorescent material, the metal content of the phosphoric acid and the phosphoric acid compound can be determined using a high-frequency inductively coupled plasma emission spectrometric analysis method (ICP-AES). The phosphoric acid is calculated as a value converted to $PO_4$. The phosphoric acid compound content of the phosphoric acid compound-adhered fluorescent material particles is determined as a sum of the phosphoric acid content and the metal content of the phosphoric acid compound.

The surface-treated fluorescent material may have an endotherm determined by differential scanning calorimetry (DSC) at 25° C. to 650° C. of, for example, 50 J/g or less, preferably 20 J/g or less, more preferably 15 J/g or less, and still more preferably substantially 0 J/g. The endotherm being substantially 0 J/g as used herein means that no endothermic peak was observed in DSC. Such a fluorescent material is obtained by, for example, heat-treating the phosphoric acid compound-adhered fluorescent material particles at a specific temperature. Heat-treating the adhered phosphoric acid compound at a specific temperature causes physical or chemical change, and the resultant fluorescent material acquires further improved moisture resistance.

The surface-treated fluorescent material can be prepared by, for example, the process as described below. In a liquid medium containing the alkaline-earth metal aluminate-containing fluorescent material particles, cations and phosphate ions to be included in the phosphoric acid compound are caused to come in contact with one another to allow the phosphoric acid compound to adhere to the surfaces of the fluorescent material particles. The phosphoric acid compound-adhered fluorescent material particles are then heat-treated at a temperature of, for example, 500° C. to 700° C. to obtain surface-treated fluorescent material particles.

The fluorescent member 50 may contain a single first fluorescent material 71 alone, or two or more in combination.

The first fluorescent material content of the fluorescent member 50 may be, for example, 35% by mass to 85% by mass, and preferably 40% by mass to 80% by mass relative to the sum of the first, the second, and the third fluorescent materials (hereinafter also simply referred to as "the sum of the fluorescent materials"). With the first fluorescent material content in this range, the light-emitting device 100 selectively absorbs shortwave components in the light emitted by the light-emitting element 10, and can have an emission spectrum in which emission intensity in the range of 435 nm or less is further reduced. This can reduce the risk of, for example, retinal damage.

The first fluorescent material content of the fluorescent member 50 may differ depending on the correlated color temperature of the light-emitting device. This can further reduce the effects on the human body, and can further reduce a decrease in luminosity.

In the light-emitting device with a correlated color temperature of 2700 K to less than 3500 K, the first fluorescent material content relative to the sum of the fluorescent materials may be, for example, 35% by mass to 60% by mass, preferably 37% by mass to 55% by mass, and more preferably 40% by mass to 50% by mass.

In the light-emitting device with a correlated color temperature of 3500 K to less than 4500 K, the first fluorescent material content relative to the sum of the fluorescent materials may be, for example, 50% by mass to 80% by mass, preferably 51% by mass to 79% by mass, and more preferably 52% by mass to 78% by mass.

In the light-emitting device with a correlated color temperature of 4500 K to less than 5700 K, the first fluorescent material content relative to the sum of the fluorescent materials may be, for example, 45% by mass to 80% by mass, preferably 46% by mass to 78% by mass, and more preferably 47% by mass to 75% by mass.

In the light-emitting device with a correlated color temperature of 5700 K to 7200 K, the first fluorescent material content relative to the sum of the fluorescent materials may be, for example, 45% by mass to 85% by mass, preferably 47% by mass to 83% by mass, and more preferably 50% by mass to 80% by mass.

Second Fluorescent Material

The second fluorescent material 72 may have a peak light-emitting wavelength in the range of 520 nm to less than 600 nm, and preferably in the range of 525 nm to 565 nm. The second fluorescent material 72 may have an emission spectrum with a half bandwidth of, for example, 20 nm or more, and preferably 30 nm or more, and, for example, 120 nm or less, and preferably 115 nm or less.

The second fluorescent material 72 may be, for example, selected from the group consisting of β sialon fluorescent materials, aluminium garnet fluorescent materials, sulfide fluorescent materials, scandium fluorescent materials, alkaline-earth metal silicate fluorescent materials, and lanthanoid silicon nitride fluorescent materials. The second fluorescent material 72 preferably contains, for example, at least one fluorescent material having a composition represented by any formula selected from the group consisting of formulas (2A) to (2G) below, more preferably contains at least one fluorescent material having a composition represented by any formula selected from the group consisting of formulas (2B), (2A), and (2G), and still more preferably contains at least one fluorescent material having a composition represented by formula (2B).

$$Si_{6-z}Al_zO_zN_{8-z}:Eu(0<z\leq4.2) \tag{2A}$$

$$(Y,Gd,Tb,Lu)_3(Al,Ga)_5O_{12}:Ce \tag{2B}$$

$$(Sr,M^1)Ga_2S_4:Eu \tag{2C}$$

$$(Ca,Sr)Sc_2O_4:Ce \tag{2D}$$

$$(Ca,Sr)_3(Sc,Mg)_2Si_3O_{12}:Ce \tag{2E}$$

$$(Ca,Sr,Ba)_2SiO_4:Eu \tag{2F}$$

$$(La,Y,Gd)_3Si_6N_{11}:Ce \tag{2G}$$

The composition represented by formula (2B) may be represented by formula (2b) below:

$$Ln_3Al_{5-p}Ga_pO_{12}{:}Ce \quad (2b)$$

In formula (2b), Ln is at least one selected from the group consisting of Y, Gd, Tb, and Lu; and p satisfies 0≤p≤3.

The composition represented by formula (2C) may be represented by formula (2c) below.

$$(Sr_{1-x-y}M^1{}_y Eu_x)Ga_2S_4 \quad (2c)$$

In formula (2c) and formula (2C), $M^1$ denotes at least one element selected from the group consisting of Be, Mg, Ca, Ba, and Zn. In formula (2c), x and y satisfy 0.03≤x≤0.25, 0≤y<0.97, and x+y<1.

The second fluorescent material 72 may have an average particle diameter of, for example, 1 μm to 40 μm, and preferably 5 μm to 30 μm. With the average particle diameter not less than the lower limit, the emission intensity can be increased. With the average particle diameter not more than the upper limit, workability during the production of the light-emitting device can be improved.

The fluorescent member 50 may contain a single second fluorescent material 72 alone, or two or more in combination.

In the fluorescent member 50, the second fluorescent material 72 content relative to the sum of the fluorescent materials may be, for example, 0.5% by mass to 60% by mass, and preferably 1% by mass to 55% by mass. With the second fluorescent material content within the above range, the light-emitting device 100 with a desired emission spectrum can more easily be produced.

The second fluorescent material 72 content of the fluorescent member 50 may differ depending on the correlated color temperature of the light-emitting device. This can reduce the effects on the human body, and can further reduce a decrease in luminosity.

In the light-emitting device with a correlated color temperature of 2700 K to less than 3500 K, the second fluorescent material content relative to the sum of the fluorescent materials may be, for example, 35% by mass to 60% by mass, preferably 37% by mass to 55% by mass, and more preferably 40% by mass to 50% by mass.

In the light-emitting device with a correlated color temperature of 3500 K to less than 4500 K, the second fluorescent material content relative to the sum of the fluorescent materials may be, for example, 8% by mass to 45% by mass, preferably 11% by mass to 39% by mass, and more preferably 12% by mass to 38% by mass.

In the light-emitting device with a correlated color temperature of 4500 K to less than 5700 K, the second fluorescent material content relative to the sum of the fluorescent materials may be, for example, 0.5% by mass to 45% by mass, preferably 1% by mass to 44% by mass, and more preferably 1% by mass to 43% by mass.

In the light-emitting device with a correlated color temperature of 5700 K to 7200 K, the second fluorescent material content relative to the sum of the fluorescent materials may be, for example, 10% by mass to 40% by mass, preferably 12% by mass to 38% by mass, and more preferably 14% by mass to 36% by mass.

Third Fluorescent Material

The third fluorescent material 73 may have a peak light-emitting wavelength in the range of 600 nm to 670 nm, and preferably in the range of 600 nm to 630 nm. The third fluorescent material 73 may have an emission spectrum with a half bandwidth in the range of, for example, 5 nm to 100 nm, and preferably 6 nm to 90 nm.

The third fluorescent material 73 preferably may contain at least one selected from the group consisting of fluorescent materials having a composition represented by, for example, any of formulas (3A) to (3F), more preferably may contain at least one selected from the group consisting of fluorescent materials having a composition represented by any of formulas (3C), (3A), and (3E), and still more preferably may contain at least one fluorescent material having a composition represented by formula (3C).

$$A_2[MF_6]{:}Mn \quad (3A)$$

In formula (3A), A denotes at least one selected from the group consisting of alkali metals and ammonium, and preferably contains at least potassium; and M denotes at least one selected from the group consisting of Group 4 to Group 14 elements, and preferably contains at least one selected from the group consisting of silicon, germanium, and titanium.

$$(i\text{-}j)MgO{\cdot}(j/2)Sc_2O_3{\cdot}kMgF_2{\cdot}mCaF_2{\cdot}(1\text{-}n)GeO_2{\cdot}(n/2)M^t{}_2O_3{:}Mn \quad (3B)$$

In formula (3B), $M^t$ is at least one selected from the group consisting of Al, Ga, and In; and i, j, k, m, n, and z respectively satisfy 2≤i≤4, 0≤j<0.5, 0<k<1.5, 0≤m<1.5, and 0<n<0.5.

$$(Ca,Sr)AlSiN_3{:}Eu \quad (3C)$$

$$M^a{}_v M^b{}_w Al_{3-y}Si_y N_y N_z{:}M^c \quad (3D)$$

In formula (3D), $M^a$ is at least one element selected from the group consisting of Ca, Sr, Ba, and Mg; $M^b$ is at least one element selected from the group consisting of Li, Na, and K; $M^c$ is at least one element selected from the group consisting of Eu, Ce, Tb, and Mn; and v, w, y and z are numbers respectively satisfying 0.80≤v≤1.05, 0.80≤w≤1.05, 0≤y≤0.5, and 3.0≤z≤5.0.

$$(Ca_{1-r-s}Sr_r Ba_s)_2 Si_5 N_8{:}Eu \quad (3E)$$

In formula (3E), r and s are numbers satisfying 0≤r≤1.0, 0≤s≤1.0, and r+s≤1.0.

$$(Ca,Sr)S{:}Eu \quad (3F)$$

The compositions represented by (3A) to (3E) above may be respectively represented by (3a) to (3e) below.

$$A_2[M_{1-a}Mn_a F_6] \quad (3a)$$

In formula (3a), A denotes at least one selected from the group consisting of alkali metals and ammonium; and M denotes at least one selected from the group consisting of Group 4 elements and Group 14 elements, and a satisfies 0.01<a<0.2.

$$(i\text{-}j)MgO{\cdot}(j/2)Sc_2O_3{\cdot}kMgF_2{\cdot}mCaF_2{\cdot}(1\text{-}n)GeO_2{\cdot}(n/2)M^t{}_2O_3{:}zMn \quad (3b)$$

In formula (3b), $M^t$ is at least one selected from the group consisting of Al, Ga, and In; and i, j, k, m, n, and z respectively satisfy 2≤i≤4, 0≤j<0.5, 0<k<1.5, 0≤m<1.5, 0<n<0.5, and 0<z<0.05.

$$(Ca_{1-p-q}Sr_p Eu_q)AlSin_3 \quad (3c)$$

In formula (3c), p and q are numbers satisfying 0≤p≤1.0, 0<q<1.0, and p+q<1.0.

$$M^a{}_v M^b{}_w M^c{}_x Al_{3-y}Si_y N_z \quad (3d)$$

In formula (3d), $M^a$ is at least one element selected from the group consisting of Ca, Sr, Ba, and Mg; $M^b$ is at least one element selected from the group consisting of Li, Na, and K; $M^c$ is at least one element selected from the group consisting of Eu, Ce, Tb, and Mn; and v, w, x, y and z are numbers respectively satisfying 0.80≤v≤1.05, 0.80≤w≤1.05, 0.001<x≤0.1, 0≤y≤0.5, and 3.0≤z≤5.0.

$$(Ca_{1-r-s}Sr_rBa_sEu_t)_2Si_5N_8 \qquad (3e)$$

In formula (3e), r, s, and t are numbers satisfying 0≤r≤1.0, 0≤s≤1.0, 0<t<1.0, and r+s+t≤1.0.

The third fluorescent material 73 may have an average particle diameter of, for example, 1 μm to 40 μm, and preferably 5 μm to 30 μm. With the average particle diameter not less than the predetermined value, the emission intensity can be increased. With the average particle diameter not more than the predetermined value, workability during the production of the light-emitting device can be improved.

The fluorescent member 50 may contain a single third fluorescent material 73 alone, or two or more in combination.

In the fluorescent member 50, the third fluorescent material content relative to the sum of the fluorescent materials may be, for example, 1% by mass to 40% by mass, and preferably 2% by mass to 35% by mass. With the third fluorescent material content within this range, the light-emitting device 100 with a desired emission spectrum can more easily be produced.

The third fluorescent material 73 content of the fluorescent member 50 may differ depending on the correlated color temperature of the light-emitting device. This can further reduce the effects on the human body, and can further reduce luminosity loss.

In the light-emitting device with a correlated color temperature of 2700 K to less than 3500 K, the third fluorescent material content relative to the sum of the fluorescent materials may be, for example, 2% by mass to 10% by mass, preferably 2.5% by mass to 9% by mass, and more preferably 3% by mass to 8% by mass.

In the light-emitting device with a correlated color temperature of 3500 K to less than 4500 K, the third fluorescent material content relative to the sum of the fluorescent materials may be, for example, 1% by mass to 18% by mass, preferably 2.5% by mass to 14% by mass, and more preferably 3% by mass to 13% by mass.

In the light-emitting device with a correlated color temperature of 4500 K to less than 5700 K, the third fluorescent material content relative to the sum of the fluorescent materials may be, for example, 3% by mass to 35% by mass, preferably 5.5% by mass to 32% by mass, and more preferably 6% by mass to 31% by mass.

In the light-emitting device with a correlated color temperature of 5700 K to 7200 K, the third fluorescent material content relative to the sum of the fluorescent materials may be, for example, 3% by mass to 10% by mass, preferably 4.5% by mass to 7% by mass, and more preferably 5% by mass to 6% by mass.

The fluorescent member may contain the first fluorescent material, the second fluorescent material, and the third fluorescent material, for example, in the ranges as described above, and the content ratio may be appropriately selected in accordance with, for example, the correlated color temperature. The total fluorescent material content of the fluorescent member may be, for example, 10% by mass to 200% by mass, preferably 20% by mass to 170% by mass or less, and more preferably 40% by mass to 120% by mass relative to the resin contained in the fluorescent member.

The fluorescent member may have a ratio of the second fluorescent material to the first fluorescent material of, for example, 0.8 to 1.5, and preferably 0.9 to 1.2 in the light-emitting device with a correlated color temperature of 2700 K to less than 3500 K. The fluorescent member may have a ratio of the second fluorescent material to the first fluorescent material of, for example, 0.1 to 0.8, and preferably 0.12 to 0.65 in the light-emitting device with a correlated color temperature of 3500 K to less than 4500 K. The fluorescent member may have a ratio of the second fluorescent material to the first fluorescent material of, for example, 0.01 to 0.7 or less, and preferably 0.02 to 0.6 in the light-emitting device with a correlated color temperature of 4500 K to less than 5700 K. The fluorescent member may have a ratio of the second fluorescent material to the first fluorescent material of, for example, 0.1 to 0.8, and preferably 0.15 to 0.65 in the light-emitting device with a correlated color temperature of 5700 K to 7200 K.

The fluorescent member may have a ratio of the third fluorescent material to the first fluorescent material of, for example, 0.05 to 0.3, and preferably 0.07 to 0.15 in the light-emitting device with a correlated color temperature of 2700 K to less than 3500 K. The fluorescent member may have a ratio of the third fluorescent material to the first fluorescent material of, for example, 0.01 to 0.2, and preferably 0.03 to 0.18 in the light-emitting device with a correlated color temperature of 3500 K to less than 4500 K. The fluorescent member may have a ratio of the third fluorescent material to the first fluorescent material of, for example, 0.01 to 0.6, and preferably 0.05 to 0.58 in the light-emitting device with a correlated color temperature of 4500 K to less than 5700 K. The fluorescent member may have a ratio of the third fluorescent material to the first fluorescent material of, for example, 0.01 to 0.2, and preferably 0.05 to 0.15 in the light-emitting device with a correlated color temperature of 5700 K to 7200 K.

The fluorescent member may have a ratio of the third fluorescent material to the second fluorescent material of, for example, 0.05 to 0.2, and preferably 0.07 to 0.15 in the light-emitting device with a correlated color temperature of 2700 K to less than 3500 K. The fluorescent member may have a ratio of the third fluorescent material to the second fluorescent material of, for example, 0.01 to 1.2, and preferably 0.05 to 1.1 in the light-emitting device with a correlated color temperature of 3500 K to less than 4500 K. The fluorescent member may have a ratio of the third fluorescent material to the second fluorescent material of, for example, 0.1 to 25, and preferably 0.15 to 23 in the light-emitting device with a correlated color temperature of 4500 K to less than 5700 K. The fluorescent member may have a ratio of the third fluorescent material to the second fluorescent material of, for example, 0.1 to 0.4, and preferably 0.13 to 0.35 in the light-emitting device with a correlated color temperature of 5700 K to 7200 K.

Resin

The fluorescent member 50 can contain at least one resin in addition to the fluorescent material 70. The resin may be either thermoplastic or thermosetting. Specific examples of the thermosetting resin include epoxy resin and silicone resin.

Other Components

The fluorescent member 50 may contain other components as appropriate in addition to the fluorescent material 70 and the resin. Examples of the other components include a filler such as silica, barium titanate, titanium oxide, aluminium oxide, a light stabilizer, and a colorant. When the fluorescent member contains, for example, a filler as the other component, the filler content relative to the resin is 0.01% by mass to 20% by mass.

The light-emitting device containing, for example, the first fluorescent material in the above ratio relative to the sum of the fluorescent materials can have an emission spectrum with less effects on the human body. The light-emitting device may have an emission spectrum with, for example, a first local maximum value P1 in a first peak wavelength in the range of 440 nm to 470 nm, a second local maximum value P2 in a second peak wavelength in the range of 490 nm to 540 nm, and a third local maximum value P3 in a third peak wavelength in the range of 570 nm to 650 nm. The emission spectrum may have a first local minimum value T1 between the first peak wavelength and the second peak wavelength, and a second local minimum value T2 between the second peak wavelength and the third peak wavelength. The first local maximum value P1 is attributable to, for example, the synthesis light of the light-emitting element and the emission spectrum of the first fluorescent material. The second local maximum value P2 is attributable to, for example, the emission spectrum of the first fluorescent material. The third local maximum value P3 is attributable to, for example, the emission spectrum of the third fluorescent material. When a plurality of local maximum values are present within any of the predetermined wavelength ranges, the one having a higher emission intensity is determined as the local maximum value in the corresponding range. When a plurality of local minimum values are present within any of the predetermined wavelength ranges, the one having a lower emission intensity is determined as the local minimum value in the corresponding range.

The light-emitting device with a correlated color temperature of 3500 K to less than 4500 K may have an emission spectrum in which the ratio of the second local minimum value T2 to the second local maximum value P2, or T2/P2, may be, for example, 0.7 to 0.99, and preferably 0.8 to 0.99. The ratio T2/P2 may be, for example, 0.6 to 0.97, and preferably 0.65 to 0.96 in the light-emitting device with a correlated color temperature of 4500 K to less than 5700 K. The ratio T2/P2 may be, for example, 0.6 to 0.97, and preferably 0.7 to 0.95 in the light-emitting device with a correlated color temperature of 5700 K to 7200 K. With the ratio T2/P2 within the above range, the emission intensity in the range of 435 nm or less may be further reduced, and the risks such as retinal damage can be further reduced.

The local maximum value or the local minimum value in an emission spectrum as used herein means an emission intensity relative to a wavelength at which the rate of change in the emission intensity relative to the wavelength is 0. When the rate of change in the emission intensity relative to the wavelength turns from a positive value to a negative value before and after the wavelength, the value is determined as a local maximum value. When the rate of change in the emission intensity turns from negative to positive, the value is determined as a local minimum value. If the rate of change in the emission intensity relative to the wavelength is 0 without positive to negative or negative to positive value change in the emission intensity before and after the wavelength, the value is neither a local maximum value or a local minimum value. In other words, the emission spectrum forms a mountain shape with a local maximum value as its peak, and a valley shape with a local minimum value as its deepest point.

The light-emitting device with a correlated color temperature of 3500 K to less than 4500 K may have an emission spectrum with a ratio of the first local maximum value P1 to the second local maximum value P2, or P1/P2, of, for example, 1.4 to 1.8, and preferably 1.45 to 1.75. The ratio P1/P2 may be, for example, 1.4 to 2.19, and preferably 1.55 to 2.1 in the light-emitting device with a correlated color temperature of 4500 K to less than 5700 K. The ratio P1/P2 may be 2.0 to 2.7, preferably 2.05 to 2.5 in the light-emitting device with a correlated color temperature of 5700 K to 7200 K. With the ratio P1/P2 in the above range, the emission spectrum may contain more blue-green components. This enables, for example, the light-emitting device to compensate for the impaired blue color vision of aged people.

Lighting Tool

The lighting tool includes at least one of the light-emitting devices described above, and may further include a reflection member, a protection member, and an attachment that provides electricity to the light-emitting device. The lighting tool may include a plurality of the light-emitting devices. The lighting tool may include a plurality of the same light-emitting devices, or a plurality of the light-emitting devices with, for example, different correlated color temperatures. The lighting tool may include a drive that individually drives a plurality of the light-emitting devices, and adjusts the luminosity and the correlated color temperature as appropriate. The lighting tool may be used as, for example, a direct-mounted, flush-mounted, or pendant light.

EXAMPLES

The present invention will now be described more in detail, but the present invention is not limited to these Examples.

As the first fluorescent material, alkaline-earth metal aluminate (hereinafter also referred to as "SAE") having a composition represented by formula (1a'), and an alkaline-earth metal halosilicate having a composition represented by formula (1b') (hereinafter also referred to as "chlorosilicate") were prepared.

$$(Sr_{0.825},Eu_{0.175})_4Al_{14}O_{25} \quad (1a')$$

$$Ca_8MgSi_4O_{16}Cl_2:Eu \quad (1b')$$

The reflectance spectrum of the prepared SAE was measured. The maximum value in the range of 380 nm to 435 nm of the relative reflectance was 8.9% as a value at 435 nm, which is not more than 30%. The maximum value of the relative reflectance of chlorosilicate in the range of 380 nm to 435 nm was 14.8% as a value at 435 nm. The SAE had a peak light-emitting wavelength of 495 nm, and a half bandwidth of 60 nm, and the chlorosilicate had a peak light-emitting wavelength of 510 nm, and a half bandwidth of 55 nm.

As the second fluorescent material, an aluminium garnet fluorescent material having a composition represented by formula (2B) below was prepared. The prepared second fluorescent material had a peak light-emitting wavelength of 547 nm, and a half bandwidth of 109 nm.

$$(Y,Gd,Tb,Lu)_3(Al,Ga)_5O_{12}:Ce \quad (2B)$$

As the third fluorescent material, fluorescent materials SCASN 1, SCASN 2, SCASN 3, SCASN 4, SCASN 5, and SCASN 6 having a composition represented by formula (3C) were prepared. SCASN 1 had a peak light-emitting wavelength of 610 nm, and a half bandwidth of 72 nm. SCASN 2 had a peak light-emitting wavelength of 620 nm, and a half bandwidth of 75 nm. SCASN 3 had a peak light-emitting wavelength of 625 nm, and a half bandwidth of 78 nm. SCASN 4 had a peak light-emitting wavelength of 630 nm, and a half bandwidth of 82 nm. SCASN 5 had a peak light-emitting wavelength of 608 nm, and a half bandwidth of 72 nm. SCASN 6 had a peak light-emitting wavelength of 627 nm, and a half bandwidth of 75 nm.

$$(Ca,Sr)AlSiN_3:Eu \quad (3C)$$

Example 1

A fluorescent material 70 was prepared to have chromaticity coordinates around x=0.314 and y=0.329. The fluorescent material 70 and silicone resin were mixed and dispersed, and then defoamed to have a fluorescent material-containing resin composition. The fluorescent material-containing resin composition contained the fluorescent materials 50.2% by mass in total relative to resin (taken as 100% by mass). The respective fluorescent material contents relative to the sum of the fluorescent materials were as follows: SAE as the first fluorescent material 71 was 59.7% by mass, the second fluorescent material 72 was 34.7% by mass, and SCASN 1 as the third fluorescent material 73 was 5.5% by mass. A molded body 40 having a recess was then prepared. A light-emitting element having a peak light-emitting wavelength of 450 nm and including a gallium nitride compound semiconductor was disposed in the recess, and the fluorescent material-containing resin composition was poured over the light-emitting element 10 to fill the recess, and then heated to be cured. Through these processes, a light-emitting device of Example 1 was prepared. The chromaticity coordinates correspond to about 6500 K correlated color temperature of the light-emitting device, which falls in the correlated color temperature in the range of 5700 K to 7200 K.

Example 2

A light-emitting device was produced in the same manner as in Example 1 except that the respective fluorescent material contents relative to the sum of the fluorescent materials were changed as shown in Table 1.

Comparative Example 1

A light-emitting device was produced in the same manner as in Example 1 except that the third fluorescent material 73 was changed to a mixture of SCASN 2 and SCASN 3 at a ratio of 50:50, and that the total fluorescent material content and the respective fluorescent material contents were changed as shown in Table 1.

TABLE 1

| | Fluorescent material content (mass %) | | | Content |
|---|---|---|---|---|
| | First fluorescent material | Second fluorescent material | Third fluorescent material | relative to resin (mass %) |
| Comparative Example 1 | 12.7 | 85.3 | 2.0 | 51.2 |
| Example 1 | 59.7 | 34.7 | 5.5 | 50.2 |
| Example 2 | 76.1 | 18.5 | 5.4 | 65.7 |

Example 3

A light-emitting device was produced in the same manner as in Example 1 except that the fluorescent material 70 was blended to have chromaticity coordinates around x=0.346, y=0.354, that the total fluorescent materials in the fluorescent material-containing resin composition was 71.5% by mass relative to resin (taken as 100% by mass), and that the respective fluorescent material contents relative to the sum of the fluorescent materials were changed so that the first fluorescent material 71 content was 69.9% by mass, the second fluorescent material 72 content was 23.3% by mass, and the third fluorescent material 73 content was 6.8% by mass. The chromaticity coordinates correspond to a correlated color temperature of the light-emitting device of about 5000 K, which falls in the correlated color temperature range of 4500 K to 5700 K.

Example 4

A light-emitting device was produced in the same manner as in Example 3 except that the third fluorescent material was changed to SCASN 5, and that the total fluorescent material content and the respective fluorescent material contents were changed as shown in Table 2.

Examples 5 and 6

A light-emitting device was produced in the same manner as in Example 3 except that the first fluorescent material was changed to chlorosilicate, that the third fluorescent material was changed to SCASN 5, and that the total fluorescent material content and the respective fluorescent material contents were changed as shown in Table 2.

Comparative Example 2

A light-emitting device was produced in the same manner as in Example 3 except that the third fluorescent material 73 was changed to a mixture of SCASN 2 and SCASN 3 at a ratio of 50:50, and that the total fluorescent material content and the respective fluorescent material contents were changed as shown in Table 2.

Comparative Examples 3 and 4

A light-emitting device was produced in the same manner as in Example 3 except that the total fluorescent material content and the respective fluorescent material contents were changed as shown in Table 2.

TABLE 2

| | Fluorescent material content (mass %) | | | Content |
|---|---|---|---|---|
| | First fluorescent material | Second fluorescent material | Third fluorescent material | relative to resin (mass %) |
| Comparative Example 2 | 24.6 | 72.7 | 2.7 | 65.0 |
| Comparative Example 3 | 91.3 | 3.2 | 5.5 | 120.5 |
| Comparative Example 4 | 37.6 | 56.2 | 6.2 | 53.2 |
| Example 3 | 69.9 | 23.3 | 6.8 | 71.5 |
| Example 4 | 66.7 | 21.2 | 12.2 | 75.0 |
| Example 5 | 47.6 | 26.2 | 26.2 | 42.0 |
| Example 6 | 69.0 | 1.4 | 29.6 | 43.5 |

Example 7

A light-emitting device was produced in the same manner as in Example 1 except that the third fluorescent material was changed to SCASN 5, that the fluorescent material 70 was blended to have the chromaticity coordinates around x=0.383, y=0.381, and that the total fluorescent material content and the respective fluorescent material contents were changed as shown in Table 3. The chromaticity coordinates correspond to a correlated color temperature of the light-emitting device of about 4000 K, which falls in the correlated color temperature range of 3500 K to less than 4500 K.

Example 8

A light-emitting device was produced in the same manner as in Example 7 except that the third fluorescent material was changed to SCASN 1, and that the total fluorescent material content and the respective fluorescent material contents were changed as shown in Table 3.

Example 9

A light-emitting device was produced in the same manner as in Example 7 except that the third fluorescent material was changed to SCASN 2, and that the total fluorescent material content and the respective fluorescent material contents were changed as shown in Table 3.

Example 10

A light-emitting device was produced in the same manner as in Example 7 except that the third fluorescent material was changed to SCASN 6, and that the total fluorescent material content and the respective fluorescent material contents were changed as shown in Table 3.

Comparative Example 5

A light-emitting device was produced in the same manner as in Example 7 except that the third fluorescent material was changed to SCASN 4, and that the total fluorescent material content and the respective fluorescent material contents were changed as shown in Table 3.

Comparative Example 6

A light-emitting device was produced in the same manner as in Example 7 except that the third fluorescent material was changed to SCASN 6, and that the total fluorescent material content and the respective fluorescent material contents were changed as shown in Table 3.

TABLE 3

| | Fluorescent material content (mass %) | | | Content |
| | First fluorescent material | Second fluorescent material | Third fluorescent material | relative to resin (mass %) |
| --- | --- | --- | --- | --- |
| Comparative Example 5 | 0.0 | 95.5 | 4.5 | 62.0 |
| Comparative Example 6 | 28.7 | 68.3 | 3.0 | 69.7 |
| Example 7 | 75.5 | 12.3 | 12.3 | 106.0 |
| Example 8 | 60.0 | 32.2 | 7.8 | 83.4 |
| Example 9 | 60.2 | 35.5 | 4.3 | 83.1 |
| Example 10 | 59.4 | 37.6 | 3.0 | 84.2 |

Example 11

A light-emitting device was produced in the same manner as in Example 1 except that the third fluorescent material was changed to SCASN 2, that the fluorescent material 70 was blended to have the chromaticity coordinates around x=0.435, y=0.404, and that the total fluorescent material content and the respective fluorescent material contents were changed as shown in Table 4. The chromaticity coordinates correspond to a correlated color temperature of the light-emitting device of about 3000 K, which falls in the correlated color temperature range of 2700 K to less than 3500 K.

Example 12

A light-emitting device was produced in the same manner as in Example 11 except that the third fluorescent material was changed to SCASN 4, and that the total fluorescent material content and the respective fluorescent material contents were changed as shown in Table 4.

Example 13

A light-emitting device was produced in the same manner as in Example 11 except that the third fluorescent material was changed to SCASN 3, and that the total fluorescent material content and the respective fluorescent material contents were changed as shown in Table 4.

Comparative Example 7

A light-emitting device was produced in the same manner as in Example 11 except that the third fluorescent material was changed to SCASN 4, and that the total fluorescent material content and the respective fluorescent material contents were changed as shown in Table 4.

Comparative Example 8

A light-emitting device was produced in the same manner as in Example 11 except that the third fluorescent material was changed to SCASN 4, and that the total fluorescent material content and the respective fluorescent material contents were changed as shown in Table 4.

TABLE 4

| | Fluorescent material content (mass %) | | | Content |
| | First fluorescent material | Second fluorescent material | Third fluorescent material | relative to resin (mass %) |
| --- | --- | --- | --- | --- |
| Comparative Example 7 | 0.0 | 93.9 | 6.2 | 88.5 |
| Comparative Example 8 | 29.7 | 65.3 | 5.0 | 100.9 |
| Example 11 | 45.7 | 48.7 | 5.6 | 109.4 |
| Example 12 | 47.0 | 48.0 | 5.0 | 106.4 |
| Example 13 | 46.9 | 48.3 | 4.7 | 106.6 |

Evaluation

For each of the light-emitting devices produced above, chromaticity coordinates, correlated color temperature, average color rendering index Ra, and special color rendering index R9 (as color rendering index) of emission color were obtained. Also, the luminous flux and emission spectrum of each light-emitting device were measured using an integrating sphere. Each measured spectral distribution was multiplied by the action function of blue-light retinal damage, and then integrated in the wavelength range of 300 nm to 700 nm to obtain the effective radiant intensity for blue-light retinal damage. In the same manner, each spectral distribution was multiplied by the action function of melatonin secretion suppression, and then integrated in the wavelength range of 400 nm to 700 nm to obtain the effective radiant intensity for melatonin secretion suppression. The ratio of effective radiant intensity for melatonin secretion suppression to the effective radiant intensity for blue-light retinal damage was calculated, and used as the effective radiant intensity ratio. A light-emitting device that serves as a reference was selected for each correlated color temperature to calculate a relative luminous flux using the luminous flux of the reference light-emitting device as a reference. A spectral distribution was obtained by converting the luminous fluxes to have the same value. The spectral distribution after the conversion was used to calculate the effective radiant intensity for blue-light retinal damage, and the effective radiant intensity for melatonin secretion suppression. Further, the resultant values were normalized with respect to the effective radiant intensity of the reference light-emitting device for each correlated color temperature. The relative effective radiant intensities, when luminous fluxes were converted to have the same value, of blue-light retinal damage and melatonin secretion suppression were calculated. The results are shown in Tables 5 to 8 for each correlated color temperature of the light-emitting device.

The respective emission spectra normalized by the peak light emitting intensity of the reference light-emitting device for the respective correlated color temperatures of the light-emitting devices are shown in FIGS. 3 to 6. Further, the ratio of the second local minimum value T2 to the second local maximum value P2, or T2/P2, and the ratio of the first local maximum value P1 to the second local maximum value P2, or P1/P2, were calculated from each emission spectrum, and are shown in Tables 5 to 7. The mark "–" in these tables indicates that the local maximum or local minimum value was not clear, and the ratio was unable to be calculated.

TABLE 5

| | Chromaticity coordinates | | Color rendering index | | Correlated color temperature | Relative luminous flux | Relative effective radiant intensity (%) | | Effective radiant intensity ratio | T2/P2 | P1/P2 |
| | | | | | | | Retinal damage | Melatonin secretion suppression | | | |
| --- | --- | --- | --- | --- | --- | --- | --- | --- | --- | --- | --- |
| | x | y | Ra | R9 | (K) | (%) | | | | | |
| Comparative Example 1 | 0.314 | 0.329 | 82.1 | 5.8 | 6457 | 100.0 | 100.0 | 100.0 | 1.31 | — | — |
| Example 1 | 0.314 | 0.329 | 87.5 | 6.7 | 6454 | 97.0 | 98.4 | 104.6 | 1.40 | 0.90 | 2.43 |
| Example 2 | 0.314 | 0.329 | 91.6 | 41.0 | 6453 | 92.9 | 97.3 | 110.3 | 1.49 | 0.78 | 2.19 |

TABLE 6

| | Chromaticity coordinates | | Color rendering index | | Correlated color temperature | Relative luminous flux | Relative effective radiant intensity (%) | | Effective radiant intensity ratio | T2/P2 | P1/P2 |
| | | | | | | | Retinal damage | Melatonin secretion suppression | | | |
| --- | --- | --- | --- | --- | --- | --- | --- | --- | --- | --- | --- |
| | x | y | Ra | R9 | (K) | (%) | | | | | |
| Comparative Example 2 | 0.346 | 0.354 | 82.1 | 6.4 | 4956 | 100.0 | 100.0 | 100.0 | 1.35 | — | — |
| Comparative Example 3 | 0.347 | 0.356 | 81.3 | 56.4 | 4911 | 87.4 | 93.8 | 122.6 | 1.77 | 0.56 | 1.25 |
| Comparative Example 4 | 0.346 | 0.352 | 79.9 | −7.6 | 4947 | 103.9 | 98.0 | 97.3 | 1.34 | 0.98 | 2.20 |
| Example 3 | 0.347 | 0.355 | 86.9 | 13.3 | 4875 | 97.9 | 96.5 | 106.2 | 1.49 | 0.91 | 2.02 |
| Example 4 | 0.346 | 0.356 | 84.5 | 0.0 | 4925 | 100.2 | 96.2 | 106.7 | 1.50 | 0.91 | 2.04 |
| Example 5 | 0.346 | 0.355 | 86.7 | 6.1 | 4925 | 100.1 | 97.6 | 103.5 | 1.44 | 0.83 | 1.90 |
| Example 6 | 0.345 | 0.356 | 90.8 | 23.5 | 4949 | 96.3 | 96.3 | 108.4 | 1.52 | 0.67 | 1.61 |

TABLE 7

| | Chromaticity coordinates | | Color rendering index | | Correlated color temperature | Relative luminous flux | Relative effective radiant intensity (%) | | Effective radiant intensity ratio | T2/P2 | P1/P2 |
| | | | | | | | Retinal damage | Melatonin secretion suppression | | | |
| --- | --- | --- | --- | --- | --- | --- | --- | --- | --- | --- | --- |
| | x | y | Ra | R9 | (K) | (%) | | | | | |
| Comparative Example 5 | 0.383 | 0.380 | 80.7 | 7.8 | 3940 | 100.0 | 100.0 | 100.0 | 1.37 | — | — |
| Comparative Example 6 | 0.383 | 0.380 | 82.0 | 13.5 | 3930 | 101.7 | 97.4 | 98.1 | 1.38 | — | — |
| Example 7 | 0.382 | 0.381 | 82.9 | −5.2 | 3962 | 97.1 | 95.0 | 114.6 | 1.66 | 0.87 | 1.51 |
| Example 8 | 0.383 | 0.382 | 81.8 | −8.0 | 3929 | 101.3 | 94.4 | 103.9 | 1.51 | 0.99 | 1.67 |
| Example 9 | 0.383 | 0.380 | 86.6 | 14.7 | 3911 | 98.4 | 95.5 | 105.7 | 1.52 | 0.97 | 1.61 |
| Example 10 | 0.383 | 0.380 | 89.9 | 33.4 | 3916 | 94.9 | 95.5 | 106.3 | 1.53 | 0.97 | 1.56 |

TABLE 8

| | Chromaticity coordinates | | Color rendering index | | Correlated color temperature | Relative luminous flux | Relative effective radiant intensity (%) | | Effective radiant intensity ratio |
|---|---|---|---|---|---|---|---|---|---|
| | x | y | Ra | R9 | (K) | (%) | Retinal damage | Melatonin secretion suppression | |
| Comparative Example 7 | 0.435 | 0.404 | 83.2 | 21.8 | 3035 | 100.0 | 100.0 | 100.0 | 1.51 |
| Comparative Example 8 | 0.435 | 0.404 | 83.6 | 20.1 | 3039 | 100.2 | 99.9 | 98.6 | 1.49 |
| Example 11 | 0.435 | 0.404 | 81.3 | −6.8 | 3036 | 104.3 | 98.7 | 101.1 | 1.55 |
| Example 12 | 0.435 | 0.404 | 88.0 | 29.1 | 3034 | 96.6 | 98.6 | 103.4 | 1.58 |
| Example 13 | 0.435 | 0.404 | 84.7 | 18.0 | 3036 | 101.0 | 98.5 | 102.5 | 1.57 |

The results shown in Tables 5 to 8 show that the effective radiant intensity ratios of the light-emitting devices in the examples according to the present invention were higher than those of the conventional light-emitting devices in the comparative examples. In other words, the risk of blue-light retinal damage is sufficiently reduced, and the melatonin secretion suppression effect is higher in the light-emitting devices according to the present invention. Further, for example, as shown in Table 6 for Comparative example 3, when an effective radiant intensity ratio exceeds the predetermined upper limit (1.70), its corresponding relative luminous flux decreases. Thus, if the effective radiant intensity ratio corresponding to its correlated color temperature is not more than the predetermined upper limit, decrease in the relative luminous flux is reduced.

Although the present disclosure has been described with reference to several exemplary embodiments, it is to be understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular examples, means, and embodiments, the disclosure may be not intended to be limited to the particulars disclosed; rather the disclosure extends to all functionally equivalent structures, methods, and uses such as are within the scope of the appended claims.

One or more examples or embodiments of the disclosure may be referred to herein, individually and/or collectively, by the term "disclosure" merely for convenience and without intending to voluntarily limit the scope of this application to any particular disclosure or inventive concept. Moreover, although specific examples and embodiments have been illustrated and described herein, it should be appreciated that any subsequent arrangement designed to achieve the same or similar purpose may be substituted for the specific examples or embodiments shown. This disclosure may be intended to cover any and all subsequent adaptations or variations of various examples and embodiments. Combinations of the above examples and embodiments, and other examples and embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure may be not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter shall be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure may be determined by the broadest permissible interpretation of the following claims and their equivalents, and shall not be restricted or limited by the foregoing detailed description.

All publications, patent applications, and technical standards mentioned in this specification are herein incorporated by reference to the same extent as if each individual publication, patent application, or technical standard was specifically and individually indicated to be incorporated by reference.

What is claimed is:

1. A method for producing a light-emitting device, comprising:
   providing a mixture comprising a first fluorescent material having a peak light-emitting wavelength in a range of 480 nm to less than 520 nm, a second fluorescent material having a peak light-emitting wavelength in a range of 520 nm to less than 600 nm, a third fluorescent material having a peak light-emitting wavelength in a range of 600 nm to 670 nm, and a resin; and
   applying the mixture on a light-emitting element having a peak light-emitting wavelength in a range of 440 nm to 470 nm;
   wherein the light-emitting device has a ratio of an effective radiant intensity for melatonin secretion suppression to an effective radiant intensity for blue-light retinal damage of:
   1.53 to 1.70 when the light-emitting device emits light with a correlated color temperature of 2700 K to less than 3500 K,
   1.40 to 1.70 when the light-emitting device emits light with a correlated color temperature of 3500 K to less than 4500 K,
   1.40 to 1.70 when the light-emitting device emits light with a correlated color temperature of 4500 K to less than 5700 K, and
   1.35 to 1.65 when the light-emitting device emits light with a correlated color temperature of 5700 K to 7200 K, wherein the first fluorescent material comprises at least one selected from the group consisting of an alkaline-earth metal aluminate and an alkaline-earth metal halosilicate, wherein the second fluorescent material comprises at least one selected from the group consisting of a β-sialon fluorescent material, an aluminum garnet fluorescent material, a sulfide fluorescent material, a scandium fluorescent material, an alkaline-earth metal silicate fluorescent material, and a lanthanoid silicon nitride fluorescent material, wherein the third fluorescent material comprises a nitride fluorescent material containing an alkaline-earth metal element, an Mn-activated fluoride fluorescent material, an Mn-activated fluorescent material containing an alkaline-earth metal element, F, Ge, and at least one element selected from Al, Ga and In, and a sulfide containing an alkaline-earth metal element, wherein when the light-emitting device emits light with a correlated color temperature of 2700 K to less than 3500 K, a ratio by mass of the first fluorescent material to a sum of the first fluorescent material, the second fluorescent material, and the third fluorescent material is 0.35 to 0.60 in the mixture, wherein when the light-emitting device emits light with a correlated color temperature of 3500 K to less than 4500 K, a ratio by mass of the first fluorescent material to a sum of the first fluorescent material, the second fluorescent material, and the third fluorescent material is 0.594 to 0.80 in the mixture, wherein when the light-emitting device emits light with a correlated color temperature of 4500 K to less than 5700 K, a ratio by mass of the first fluorescent material to a sum of the first fluorescent material, the second fluorescent material, and the third fluorescent material is 0.45 to 0.80 and a ratio by mass of the third fluorescent material to the sum of the first fluorescent material, the second fluorescent material, and the third fluorescent material is 0.055 to 0.35 in the mixture, and wherein when the light-emitting device emits light with a correlated color temperature of 5700 K to 7200 K, a ratio by mass of the first fluorescent material to a sum of the first fluorescent material, the second fluorescent material, and the third fluorescent material is 0.597 to 0.85.

2. The method according to claim 1, wherein the ratio of an effective radiant intensity for melatonin secretion suppression to an effective radiant intensity for blue-light retinal damage is:

1.54 to 1.65 when the light-emitting device emits light with a correlated color temperature of 2700 K to less than 3500 K, 1.45 to 1.70 when the light-emitting device emits light with a correlated color temperature of 3500 K to less than 4500 K, 1.43 to 1.60 when the light-emitting device emits light with a correlated color temperature of 4500 K to less than 5700 K, and 1.37 to 1.55 when the light-emitting device emits light with a correlated color temperature of 5700 K to 7200 K.

3. The method according to claim 1 further comprising: heat-treating the mixture to be cured.

4. The method according to claim 1, wherein the light-emitting element is disposed in a recess of a molded body.

5. The method according to claim 1, wherein
the first fluorescent material has a peak light-emitting wavelength of 485 nm to 515 nm, and an emission spectrum with a half bandwidth of 30 nm to 80 nm,
the second fluorescent material has a peak light-emitting wavelength of 525 nm to 565 nm, and an emission spectrum with a half bandwidth of 20 nm to 120 nm, and
the third fluorescent material has a peak light-emitting wavelength of 600 nm to 630 nm, and an emission spectrum with a half bandwidth of 5 nm to 100 nm.

6. The method according to claim 1, wherein the first fluorescent material comprises at least one fluorescent material having a composition represented by formula (1A) or (1B):

$$Sr_4Al_{14}O_{25}:Eu \qquad (1A)$$

wherein Sr may be partially substituted by at least one element selected from the group consisting of Mg, Ca, Ba, and Zn $$(Ca,Sr,Ba)_8MgSi_4O_{16}(F,Cl,Br)_2:Eu \qquad (1B)$$

7. The method according to claim 1, wherein the second fluorescent material comprises a fluorescent material having a composition represented by formula (2B):

$$(Y,Gd,Tb,Lu)_3(Al,Ga)_5O_{12}:Ce \qquad (2B)$$

8. The method according to claim 1, wherein the third fluorescent material comprises a fluorescent material having a composition represented by formula (3):

$$(Ca,Sr)AlSiN_3:Eu \qquad (3C)$$

9. The method according to claim 1, wherein the light-emitting device has an average color rendering index Ra of 80 or more.

10. The method according to claim 1, wherein the light-emitting element has a peak light-emitting wavelength of 445 nm to 465 nm, and an emission spectrum with a half bandwidth of 30 nm or less.

11. The method according to claim 1, wherein a ratio by mass of the third fluorescent material to a sum of the first fluorescent material, the second fluorescent material, and the third fluorescent material is,
0.02 to 0.10 when the light-emitting device emits light with a correlated color temperature of 2700 K to less than 3500 K,
0.03 to 0.18 when the light-emitting device emits light with a correlated color temperature of 3500 K to less than 4500K,
0.055 to 0.35 when the light-emitting device emits light with a correlated color temperature of 4500 K to less than 5700 K, and
0.03 to 0.10 when the light-emitting device emits correlated color temperature of 5700 K to 7200 K.

12. The method according to claim 1, wherein the first fluorescent material has an average particle diameter of 3 mm to 40 mm.

13. The method according to claim 1, wherein the second fluorescent material has an average particle diameter of 1 mm to 40 mm.

14. The method according to claim 1, wherein the third fluorescent material has an average particle diameter of 1 mm to 40 mm.

15. The method according to claim 1, wherein the first fluorescent material comprises a surface-treated fluorescent material.

16. The method according to claim 15, wherein the surface-treated fluorescent material comprises fluorescent material particles containing alkaline-earth metal aluminate and a phosphoric acid compound arranged on the surface of the fluorescent material particles.

17. The method according to claim 16, wherein the phosphoric acid compound is at least one selected from the group consisting of Group 2 element phosphate, rare-earth phosphate, Group 13 element phosphate, zinc phosphate, antimony phosphate, and bismuth phosphate.

18. The method according to claim 16, wherein the phosphoric acid compound is arranged as particles or as a film.

19. The method according to claim 16, wherein the surface-treated fluorescent material contains the phosphoric acid compound as a phosphoric acid content of 0.0001% by mass to 20% by mass.

20. The method according to claim 1, wherein a ratio by mass of the second fluorescent material to a sum of the first fluorescent material, the second fluorescent material, and the third fluorescent material is 0.005 to 0.6.

21. The method according to claim 1, wherein a ratio by mass of the third fluorescent material to a sum of the first fluorescent material, the second fluorescent material, and the third fluorescent material is 0.01 to 0.4.

* * * * *